(12) United States Patent
Lu

(10) Patent No.: US 8,680,541 B2
(45) Date of Patent: Mar. 25, 2014

(54) LED STRUCTURE AND THE LED PACKAGE THEREOF

(75) Inventor: Chih-Chiang Lu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 370 days.

(21) Appl. No.: 12/964,386

(22) Filed: Dec. 9, 2010

(65) Prior Publication Data

US 2011/0133228 A1   Jun. 9, 2011

(30) Foreign Application Priority Data

Dec. 9, 2009   (TW) ................................. 98142209 A

(51) Int. Cl.
*H01L 29/18* (2006.01)
*H01L 33/00* (2010.01)

(52) U.S. Cl.
USPC ...................... 257/88; 257/E33.066; 438/29

(58) Field of Classification Search
USPC .............. 257/13, 14, 21, 79, 80, 81, 88, 98,
257/E33.001–E33.017, E33.056–E33.068,
257/E23.02, E23.024–E23.025; 438/26, 29,
438/118
See application file for complete search history.

(56) References Cited

U.S. PATENT DOCUMENTS

| | | | |
|---|---|---|---|
| 3,936,694 A | 2/1976 | Akiyama | |
| 6,547,249 B2 * | 4/2003 | Collins et al. | 257/88 |
| 7,531,843 B2 * | 5/2009 | Lin et al. | 257/90 |
| 7,560,738 B2 * | 7/2009 | Liu | 257/88 |
| 2004/0075399 A1 * | 4/2004 | Hall | 315/291 |
| 2007/0262328 A1 | 11/2007 | Bando | |

FOREIGN PATENT DOCUMENTS

| | | |
|---|---|---|
| JP | 11-243230 | 9/2011 |
| TW | 200901421 A | 1/2009 |

* cited by examiner

*Primary Examiner* — Sonya D McCall Shepard
(74) *Attorney, Agent, or Firm* — Muncy, Geissler, Olds & Lowe, P.C.

(57) ABSTRACT

Disclosed is a light-emitting diode structure comprises a substrate, a plurality of light-emitting diodes on the substrate, and a conductive layer laid on the surface thereof. Each light-emitting diode comprises at least an electrical coupling side close to another electrical coupling side of an adjacent light-emitting diode. Each light-emitting diode comprises at least a first and a second electrode on the surface along the electrical coupling side, so that two close first or second electrodes can be soldered at the same time in wire soldering process, so as to make the light-emitting diodes connect in parallel. One end of the conductive layer is connected to the first electrode of a light-emitting diode and the other end is close to the second electrode of another light-emitting diode, so that the second electrode and the conductive layer can be soldered at the same time in wire soldering process, so as to make the light-emitting diodes connect in series.

16 Claims, 10 Drawing Sheets

_US 8,680,541 B2_

LED STRUCTURE AND THE LED PACKAGE THEREOF

REFERENCE TO RELATED APPLICATION

This application claims the right of priority based on Taiwan application Ser. No. 098142209, filed on Dec. 9, 2009, the entirety of which is incorporated by reference herein.

TECHNICAL FIELD

The application relates to a semiconductor device, in particular to a light-emitting diode structure, and a light-emitting diode device or package.

DESCRIPTION OF BACKGROUND ART

The theory for a light-emitting diode (LED) to emit light is based on that when a forward voltage power is applied to a p-n junction, the electrons are driven from the n-type semiconductor and the holes are driven from the p-type semiconductor to combine and emit light. The forward voltage power needed is usually supplied by an external power through the p-type and n-type electrodes via conductive wires connected thereto.

As shown in FIG. 1, a known light-emitting diode 101 is set on a carrier 10, and a p-type electrode 104 is electrically connected to the conductive electrode 107 on the carrier 10 via the conductive wire 103, and an n-type electrode 105 is electrically connected to the conductive electrode 106 on the carrier 10 via the conductive wire 102.

FIG. 2A and FIG. 2B illustrate the top views of the structures of light-emitting diodes in parallel (FIG. 2A) and in series (FIG. 2B) connection respectively. A plurality of light-emitting diodes 21 which are the same as the ones shown in FIG. 1 are set on the carrier 20. When a parallel connection is necessary, the light-emitting diodes 21 are electrically connected to conductive electrodes 220, 221 on the carrier board 22 respectively by the conductive wires as shown in FIG. 2A. When a series connection is necessary, as shown in FIG. 2B, the electrodes of different polarity of adjacent light-emitting diodes 21 are electrically connected in series with the conductive wires, and the other two electrodes of different polarity are electrically connected to conductive electrodes 220, 221 on the carrier board 22 to make the light-emitting diodes form a series connection.

It is conventional to use the method illustrated in the FIGS. 2A and 2B to make light-emitting diodes in parallel or series connection. But as the number of the light-emitting diodes to be connected increases, the number of the conductive wires used for soldering also increases. Therefore, the possibility of wires broken during the package process also rises so the devices fail easily. Moreover, no matter for parallel or serial connections, every electrode needs a wire for soldering, and since the size of light-emitting diode is very small, a precise control is necessary for a wire-soldering machine to move back and forth to align and solder, and the throughput of a wire-soldering machine is therefore limited.

FIG. 3 shows another structure for light-emitting diodes connected in series. A plurality of light-emitting diodes 31 is set on the carrier 30, and each light-emitting diode 31 has a p-type electrode 315 and an n-type electrode 316. The light-emitting diode structure 3 is covered by a dielectric layer 32, but the p-type electrode 315 and the n-type electrode 316 are exposed. A conductive layer 33 is laid on the dielectric layer 32 to connect the p-type electrode 315 of one light-emitting diode 31 to the n-type electrode 316 of another light-emitting diode 31 to form a series connection.

Although using the conductive layer 33 on a light-emitting diode chip to connect the electrodes can avoid the prescribed disadvantage of in wire-soldering method, different designs are required for different type of series or parallel connections, and the chips can not be universally and effectively used.

SUMMARY OF THE DISCLOSURE

It is an objection of the present application to provide a light-emitting diode structure comprising a substrate; a plurality of light-emitting diodes on the substrate, wherein each of the light-emitting diodes has an electrical coupling side, at least one first electrode and at least one second electrode is on the surface of the light-emitting diode close to the electrical coupling side, two of the light-emitting diodes adjacent to each other form a light-emitting diode group, the electrical coupling sides of each one of the light-emitting diodes of the light-emitting diode group are close to each other so that the first electrodes of the light-emitting diode group can be soldered at the same time, the second electrodes of the light-emitting diode group can be soldered at the same time; and at least one conductive layer, wherein one end of the conductive layer is connected to the first electrode of one of the light-emitting diodes, the other end of the conductive layer extends to an adjacent area of at least one of the second electrodes of the adjacent light-emitting diode, with a distance that can be soldered to the second electrode at the same time.

DETAILED DESCRIPTION OF PREFERRED EMBODIMENTS

The embodiments are described hereinafter in accompany with drawings.

The First Embodiment

Figure 1:
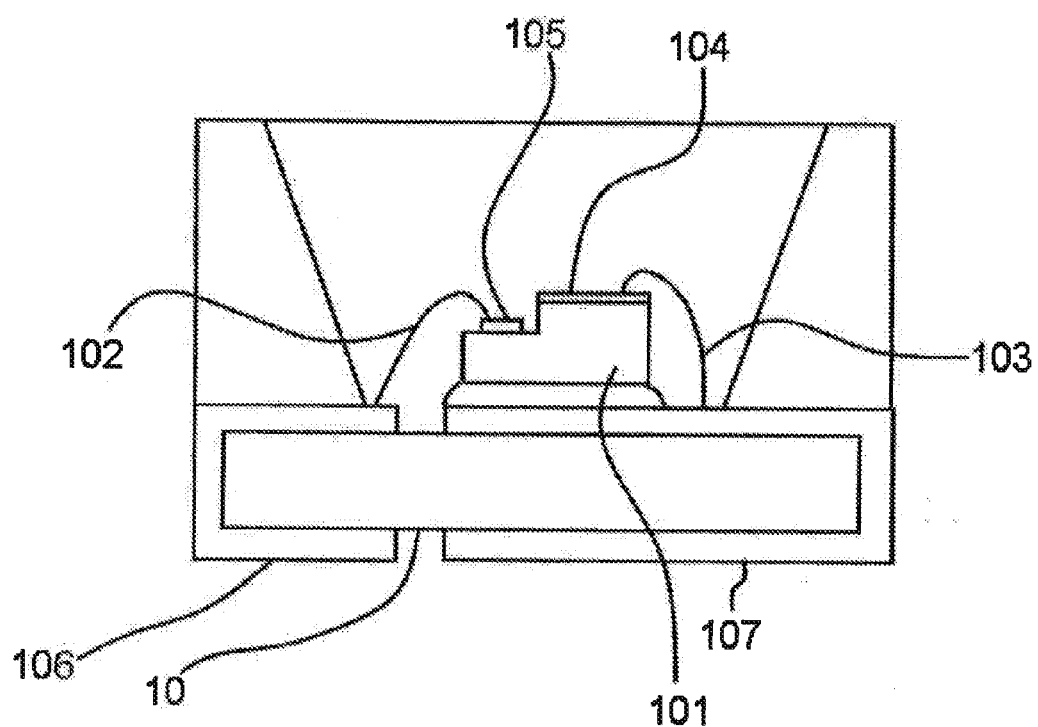
FIG. 1 illustrates a side view for a known light-emitting diode device.
Figure 2A:
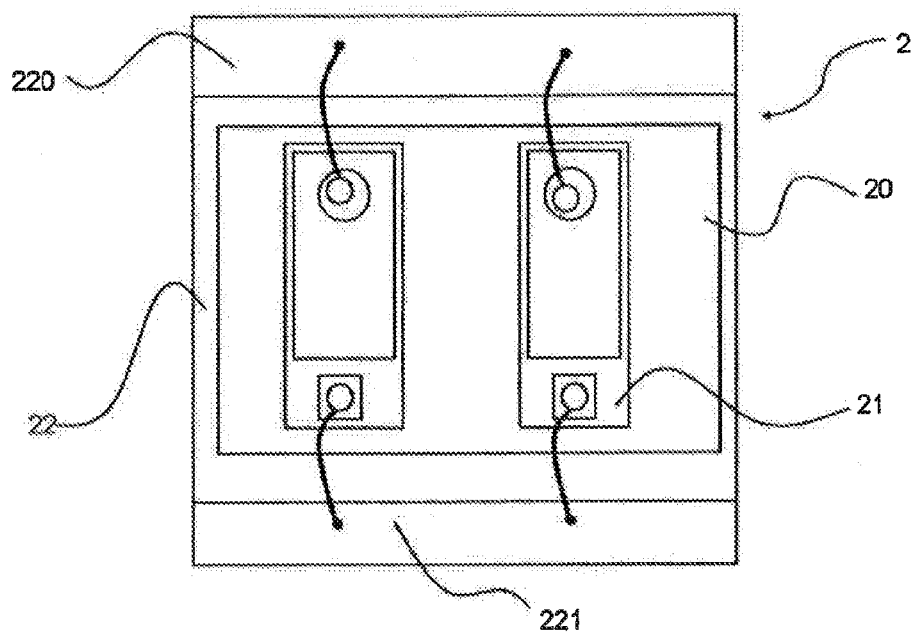
FIG. 2A and FIG. 2B illustrate the top views respectively for the known structure of light-emitting diodes in parallel (FIG. 2A) and in series (FIG. 2B) connections.
Figure 2B:
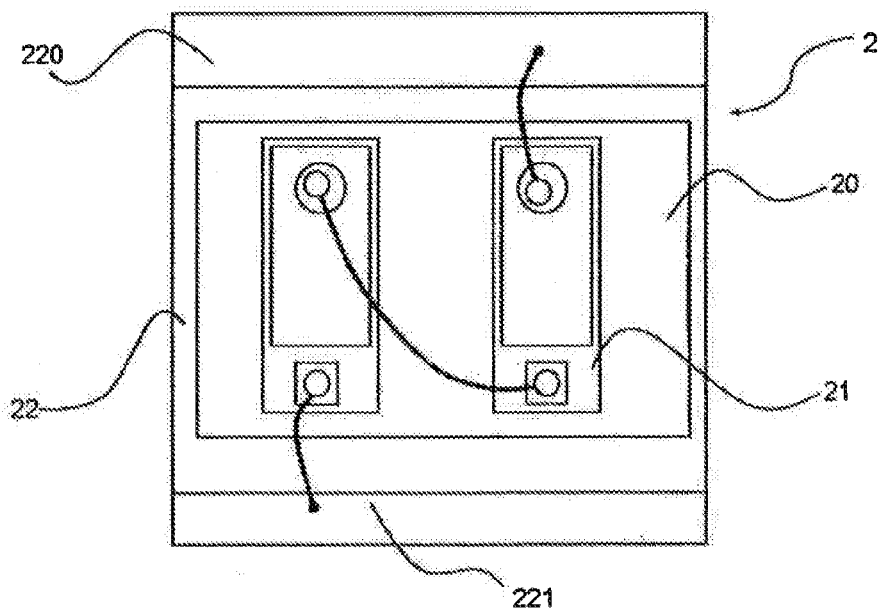
Figure 3:
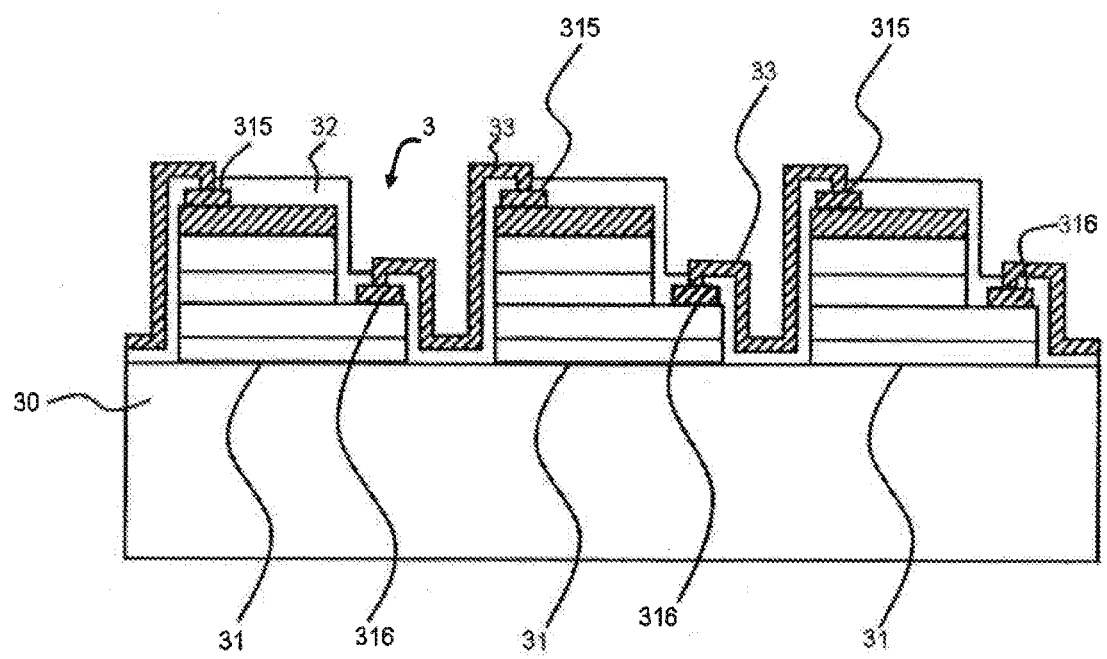
FIG. 3 illustrates another known structure for light-emitting diodes in series connection.
Figure 4A:
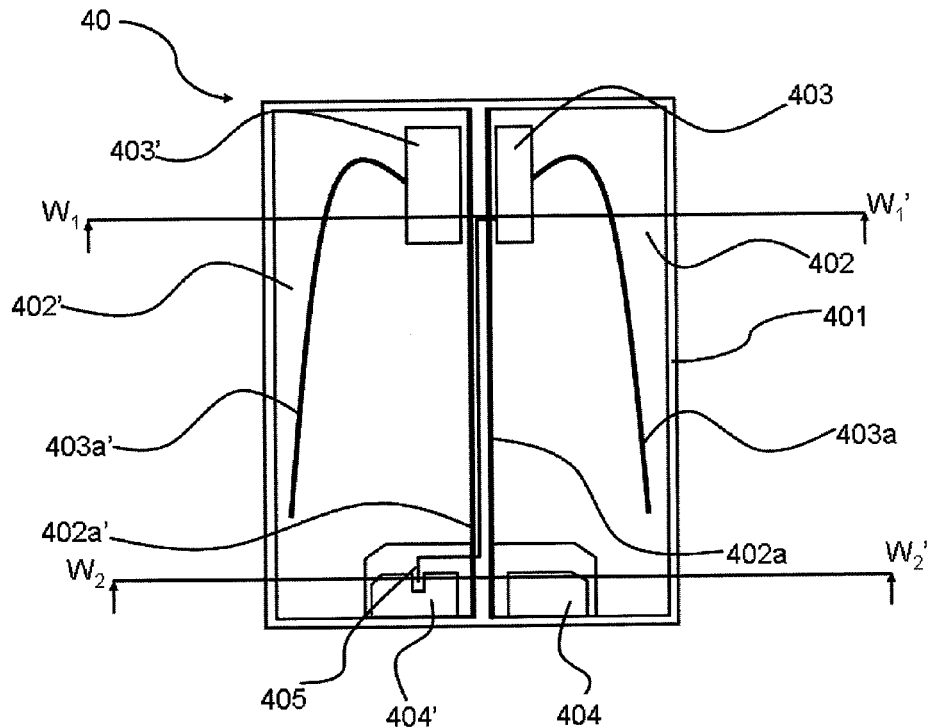
FIG. 4A illustrates a top view for a light-emitting diode structure in accordance with the first embodiment of the present application.

As shown in FIG. 4A, an embodiment for a light-emitting diode structure 40 of the present application comprises a substrate 401, and two light-emitting diode 402, 402' on the substrate 401, with a side 402a of light-emitting diode 402 and a side 402a' of light-emitting diode 402' being set close to each other. A first electrode 403 and a second electrode 404 are set on the surface near the side 402a of the light-emitting diode 402, and an extending electrode 403a can be optionally set to extend the first electrode 403 to spread the current. Similarly, a first electrode 403' and a second electrode 404' are set on the surface near the side 402a' of the light-emitting diode 402', and an extending electrode 403a' can be optionally set to extend the first electrode 403' to spread the current. The first electrode 403' and the first electrode 403 are set at a distance close enough to each other to be soldered together at the same time. Similarly, the second electrode 404' and the second electrode 404 are set at a distance close enough to each other to be soldered together at the same time, so that they can be soldered with a wire to form a parallel connection (described later). From the foregoing description, the light-emitting diodes 402 and 402' can be connected in parallel is because the side 402a and 402a' are close to each other, so the side 402a and 402a' respectively can be viewed as an electrical coupling side for parallel connection.

The light-emitting structure 40 further comprises a conductive layer 405 on its surface. One end of the conductive layer 405 is connected to the first electrode 403 of the light-emitting diode 402, and the other end extends toward to an adjacent area of the second electrode 404' of the light-emitting diode 402', with a distance to the second electrode 404' to be soldered together with the second electrode 404' at the same time, so that they can be soldered to form a series connection (described later). The first electrode 403 is connected to the conductive layer 405 for a subsequent connection to the second electrode 404', therefore it can be viewed as a first electrode for the series connection. The first electrode 403' is not connected to the conductive layer 405 but to an external power supply, so the first electrode 403' can be viewed as a first electrode for an external power connection. The second electrode 404' is adjacent to one end of the conductive layer 405 to be connected to the first electrode 403 in following process, so the second electrode 404' can be viewed as a second electrode for the series connection. The second electrode 404 is used for a connection to an external power supply, so the second electrode 404 can be viewed as a second electrode for a connection to an external power.

Figure 4B:
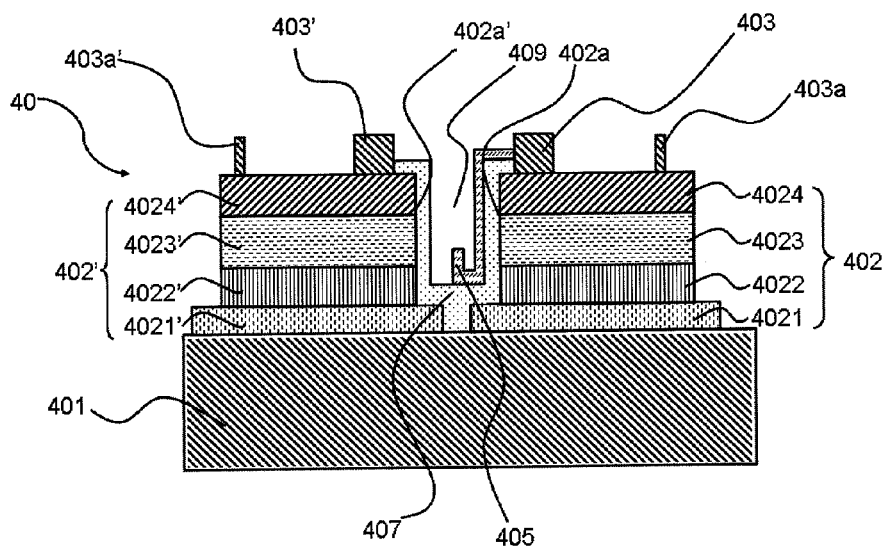
FIG. 4B illustrates a side view for the light-emitting diode structure along the W1-W1' line in FIG. 4A in accordance with the first embodiment of the present application.
Figure 4C:
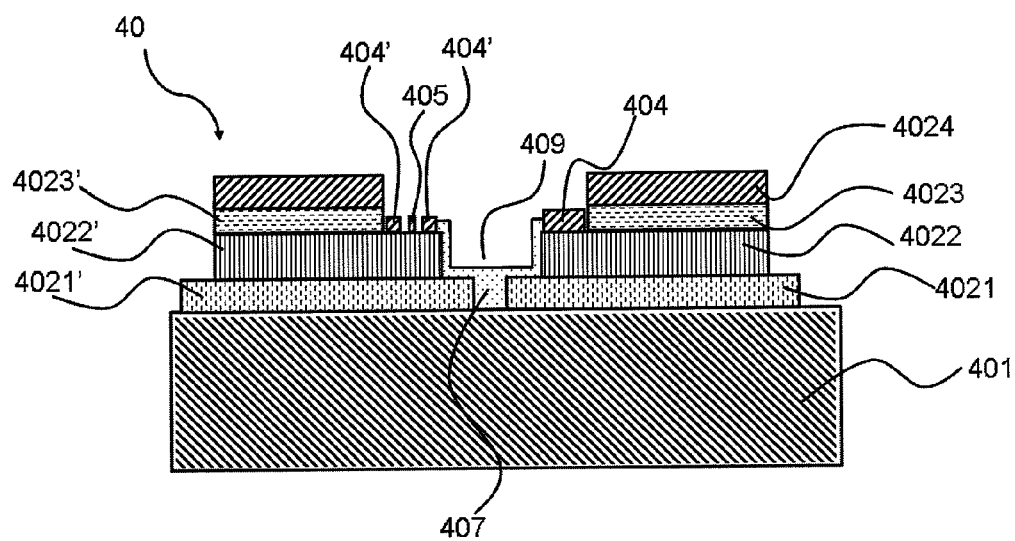
FIG. 4C illustrates a side view for the light-emitting diode structure along the W2-W2' line in FIG. 4A in accordance with the first embodiment of the present application.

Please refer to FIG. 4B and FIG. 4C together. FIG. 4B is the cross-sectional view for the light-emitting diode structure 40 along the W1-W1' line in FIG. 4A. A trench 409 is formed between the two adjacent light-emitting diodes 402, 402', so the two adjacent light-emitting diodes 402, 402' are physically separated from each other. A dielectric layer 407 is formed to cover partial surface of the two light-emitting diodes 402,402' and the area between them, but the first electrodes 403 and 403' are exposed for soldering. The conductive layer 405 previously described is formed on the dielectric layer 407 with one end connected to the first electrode 403.

The structure of the light-emitting diode 402 (402') can be a stack comprising, from bottom to top, a buffer layer 4021 (4021'), an n-type semiconductor layer 4022 (4022'), a light-emitting layer 4023 (4023'), and p-type semiconductor layer 4024 (4024'). The first electrode 403 (403') and the extending electrode 403a (403a') are a p-type electrode formed on the p-type semiconductor layer 4024 (4024').

FIG. 4C is the cross-sectional view for the light-emitting structure 40 along the W2-W2' line in FIG. 4A. A trench 409 is formed between the two adjacent light-emitting diodes 402, 402', so the two adjacent light-emitting diodes 402, 402' are physically separated from each other. A dielectric layer 407 is formed to cover partial surface of the two light-emitting diodes 402, 402' and the area between them, but the second electrode 404 and 404' are exposed for soldering. The conductive layer 405 which has one end connected to the first electrode 403 as described in FIG. 4B is approached to but does not contact with the second electrode 404'. The second electrode 404 (404') is electrically connected to the n-type semiconductor 4022 (4022') and is an n-type electrode.

Nevertheless, it should be noted that this embodiment illustrates only examples of light-emitting diodes of a basic type, and the structure and the form of electrode of the light-emitting diode 402 (402') is not limited to those described above. Other type structure or elements not illustrated, such as a contact layer, a current barrier layer, or a roughed surface structure can be added.

Figure 4D:
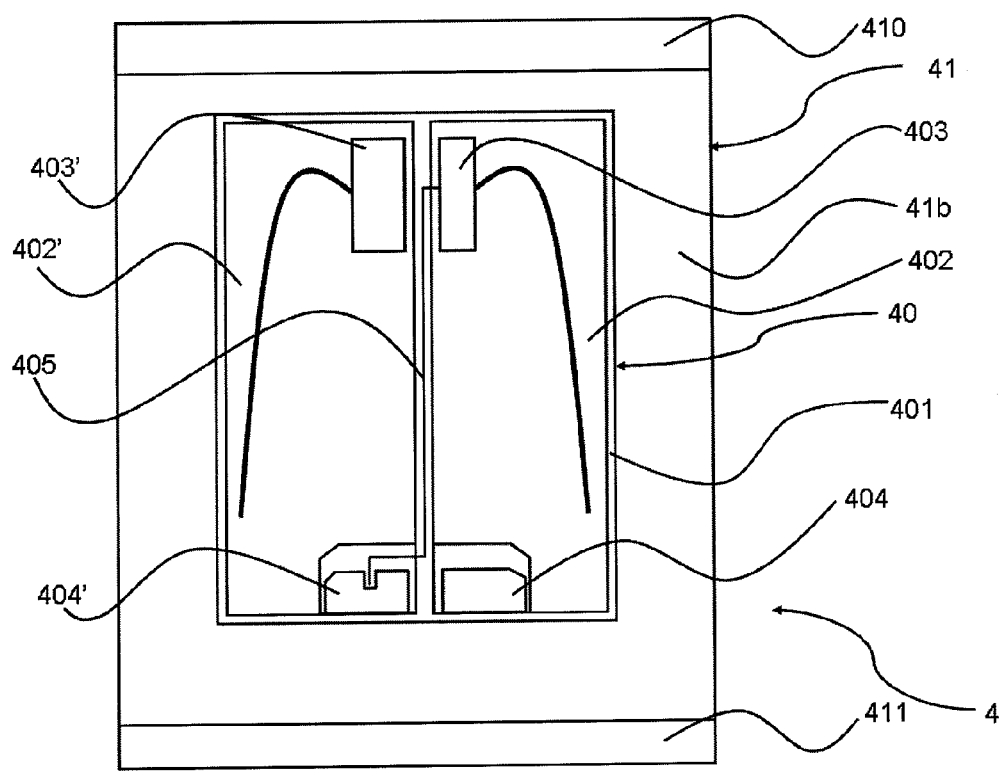
FIG. 4D illustrates a top view for a light-emitting diode device in accordance with the first embodiment of the present application.

As shown in FIG. 4D, the light-emitting diode structure 40 comprises a substrate 401 formed on the surface 41b of a carrier board 41, and two light-emitting diodes 402, 402' formed on the substrate 401. A first conductive port 410 and a second conductive port 411 are set on the carrier board 41, and can be used to electrically connect the first electrode 403 (403') and the second electrode 404 (404') of the light-emitting diode 402 (402') to the first conductive port 410 and a second conductive port 411 respectively by soldering. A packaged device 4 with the light-emitting diode structure 40 is formed accordingly. With different soldering arrangement, the light-emitting diode 402 and the light-emitting diode 402' can form a parallel or series connections.

A first conductive port 410 and a second conductive port 411 can be, for example, lead frames set at opposite sides of the carrier board 41 while the light-emitting diode structure 40 is located between thereof. In one embodiment, the distance between the first electrode 403 and the first electrode 403', the distance between the second electrode 404 and the second electrode 404', and the distance between one end of the conductive layer 405 and the second electrode 404', are preferably less than 100 μm for facilitating soldering together at the same time in the following process.

Figure 4E:
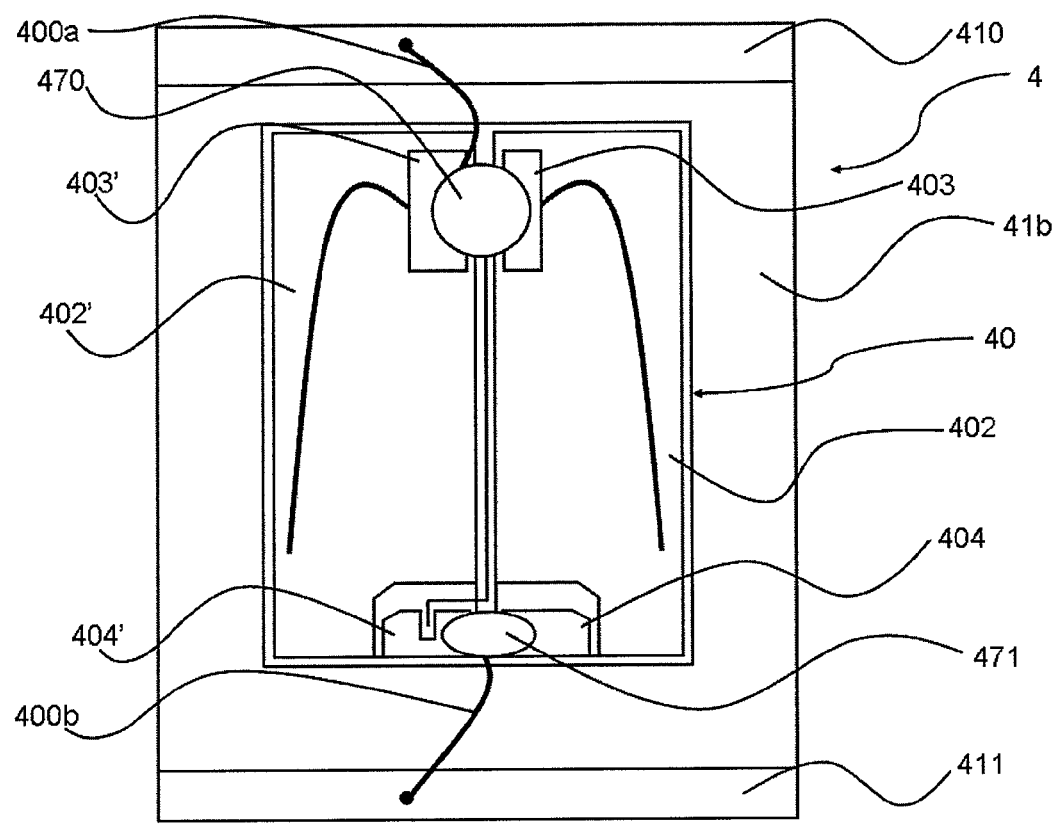
FIG. 4E illustrates a top view for a light-emitting diode device with light-emitting diodes in parallel connection in accordance with the first embodiment of the present application.

As shown in FIG. 4E, by using a wire-soldering machine (not shown), a conductive solder ball 470 is formed on both the first electrode 403 and the first electrode 403', which are close to each other. And then a first wire 400a is soldered to connect the first conductive solder ball 470 and the first conductive port 410. The conductive solder ball 470 is a gold ball, and the first wire 400a is a gold wire, for example. In a similar way, a conductive solder ball 471 is formed on both the second electrode 404 and the second electrode 404', which are close to each other. And then a second wire 400b is soldered to connect the second conductive solder ball 470 and the second conductive port 411. The encapsulant (not shown) is then used to form a packaged device 4 with the light-emitting diode 402 and the light-emitting diode 402' connected in parallel connection.

Figure 4F:
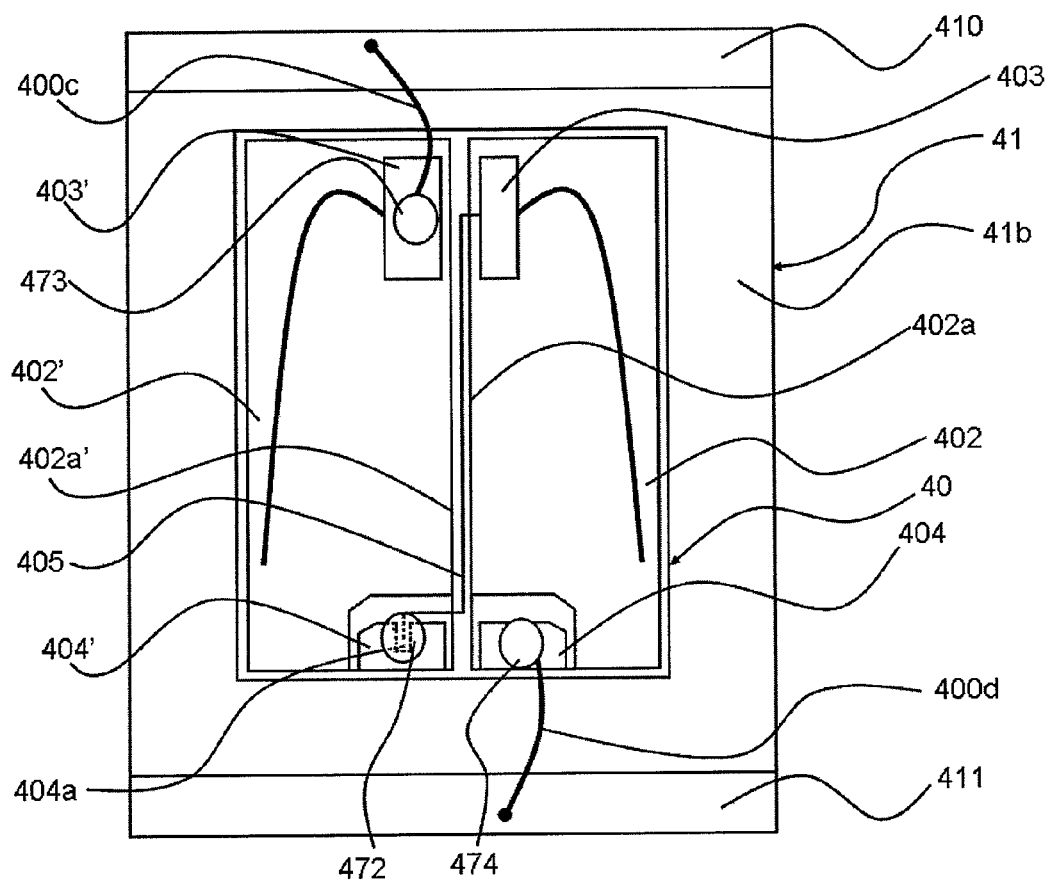
FIG. 4F illustrates a top view for a light-emitting diode device with light-emitting diodes in series connection in accordance with the first embodiment of the present application.

As shown in FIG. 4F, by using a wire-soldering machine (not shown), a conductive solder ball 472 is formed on both the second electrode 404' and one end of the conductive layer 405 which extends from the first electrode 403. The conductive solder ball 472 is a gold ball. Then a first wire 400c is soldered to connect the first electrode 403' to the first conductive port 410 from a conductive solder ball 473. And then, similarly, a second wire 400d is soldered to connect the second electrode 404 to the second conductive port 411 from a conductive solder ball 474. The wire 400c and 400d are gold wires. Thus, a series connection is formed. The encapsulant (not shown) is then used to form a packaged device 4 with the light-emitting diode 402 and the light-emitting diode 402' in series connection. As the above description, the first electrode 403 and the second electrode 404' are connected in series via the conductive layer 405 and the conductive solder ball 472, so the first electrode 403 and second electrode 404', respectively, can be viewed as a first electrode and a second electrode for the series connection. The first electrode 403' and the second electrode 404 are connected to the first conductive port 410 and the second conductive port 411 respectively, so the first electrode 403' and the second electrode 404 can be viewed as a first electrode and a second electrode respectively for the series connection to an external power. In addition, a recess 404a can be formed on the second electrode 404' for the end of the conductive layer 405 to extend into, so that the area for conductivity increases when the conductive solder ball 472 is soldered onto.

The Second Embodiment

The second embodiment is similar to the first embodiment, and the main difference is that the light-emitting diode structure 50 of this embodiment comprises multiple light-emitting diode groups which each group comprises two light-emitting diodes.

Figure 5A:
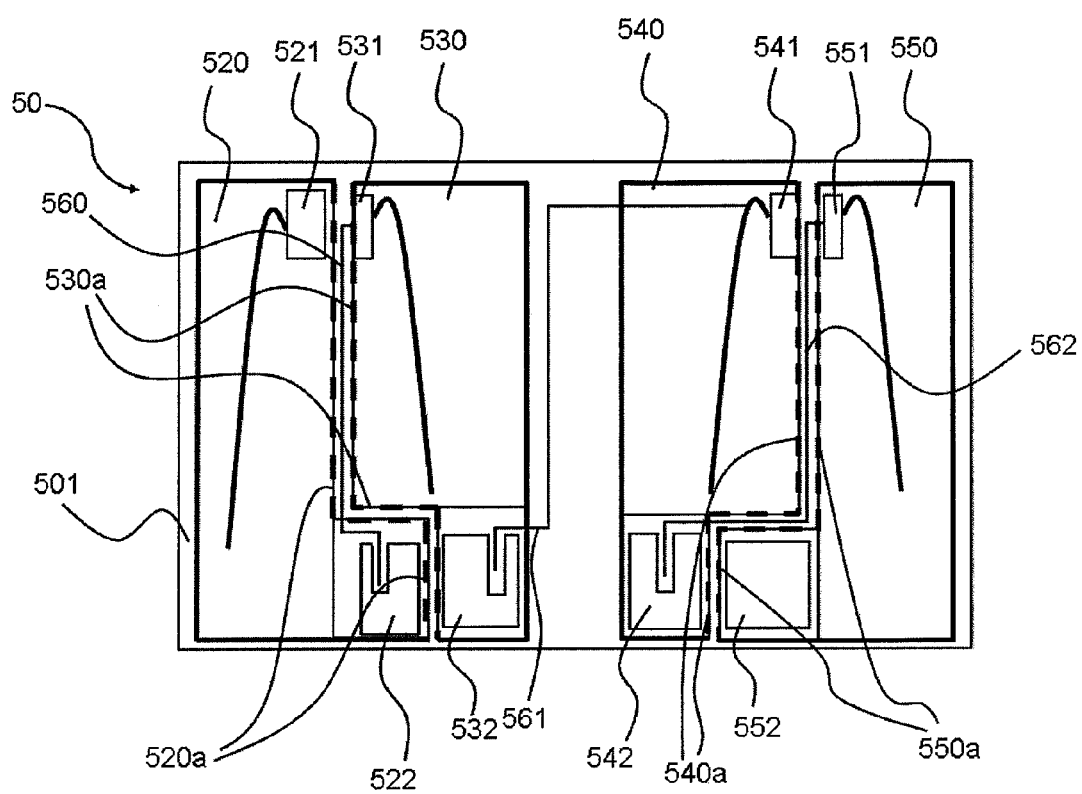
FIG. 5A illustrates a top view for a light-emitting diode device in accordance with the second embodiment of the present application.

As shown in FIG. 5A, the light-emitting diode structure 50 comprises a substrate 501, and four light-emitting diodes 520, 530, 540, and 550 on the surface of substrate 501. The two adjacent light-emitting diodes 520, 530 form a group, and the two adjacent light-emitting diodes 540, 550 form another group. Just like the first embodiment, as indicated by the dash lines shown in the figure, light-emitting diodes 520, 530 have electrical coupling sides 520a, 530a respectively, and the light-emitting diodes 520, 530, have a first electrode 521, 531 respectively that the two electrodes are near each other. The light-emitting diodes 520, 530 also have a second electrode 522, 532 respectively that the two electrodes are near to each other. Similarly, as indicated by the dash lines, light-emitting diodes 540, 550 have an electrical coupling side 540a, 550a respectively, and the light-emitting diodes 540, 550 have a first electrode 541, 551 respectively that the two electrodes are near each other. The light-emitting diodes 540, 550 also have a second electrode 542, 552 respectively that the two electrodes are near each other. Similar to the first embodiment, the first or second electrodes near each other are for a subsequent soldering process, so that the light-emitting diodes are connected in parallel. As the four light-emitting diodes in this embodiment are just illustrated as an example, other number of light-emitting diodes may be set on substrate 501. Nevertheless, the two light-emitting diodes set as a group are illustrated as an example, and other number of light-emitting diodes may be set as a group by the persons having ordinary skills in the art to fulfill the requirement.

The light-emitting diode structure 50 further comprises conductive layers 560, 561, and 562 on its surface. One end of the conductive layer 560 is connected to the first electrode 531 of the light-emitting diode 530, and the other end is approached to but does not contact with the second electrode 522 of the light-emitting diode 520; one end of the conductive layer 561 is connected to the first electrode 541 of the light-emitting diode 540, and the other end is approached to but does not contact with the second electrode 532 of the light-emitting diode 530; one end of the conductive layer 562 is connected to the first electrode 551 of the light-emitting diode 550, and the other end is approached to but does not contact with the second electrode 542 of the light-emitting diode 540. Similar to the first embodiment, the above illustration facilitates a following soldering process to connect light-emitting diode 520, 530, 540, and 550 in series.

Similar to the first embodiment, the distance between the first electrodes 521, 531, the distance between the first electrodes 541, 551, the distance between the second electrodes 522, 532, the distance between the second electrodes 542, 552, the distance between one end of the conductive layer 560 and the second electrode 522, the distance between one end of the conductive layer 561 and the second electrode 532, and the distance between one end of the conductive layer 562 and the second electrode 542 are all preferably less than 100 μm.

The structure and the form of electrode of each of the light-emitting diodes for the light-emitting diode structure 50 can be the same as those in the first embodiment or other type. Besides, the details such as the design for the conductive layer and the second electrode, and a dielectric layer which may be set between the conductive layer and the light-emitting diode structure 50, are the same as those in the first embodiment or other conventional skills of the technology, and are therefore not described here.

As there are multiple light-emitting diode groups for the light-emitting diode structure 50 in this embodiment, and to facilitate the following soldering process to connect the light-emitting diodes in series or parallel, the electrical coupling sides of the two light-emitting diodes of the light-emitting diode groups are respectively designed as complementary concave and convex shapes. The second electrodes 532, 522 are respectively set at complementary concave and convex part of the light-emitting diodes 530, 520, so that the second electrode 522 is close to the second electrode 532, and the conductive layer 560 extends from the first electrode 531 to the adjacent area of the second electrode 522 through the sides 520a, 530a. Similarly, the sides 540a, 550a of the light-emitting diodes 540, 550 have the same function as the above description.

Figure 5B:
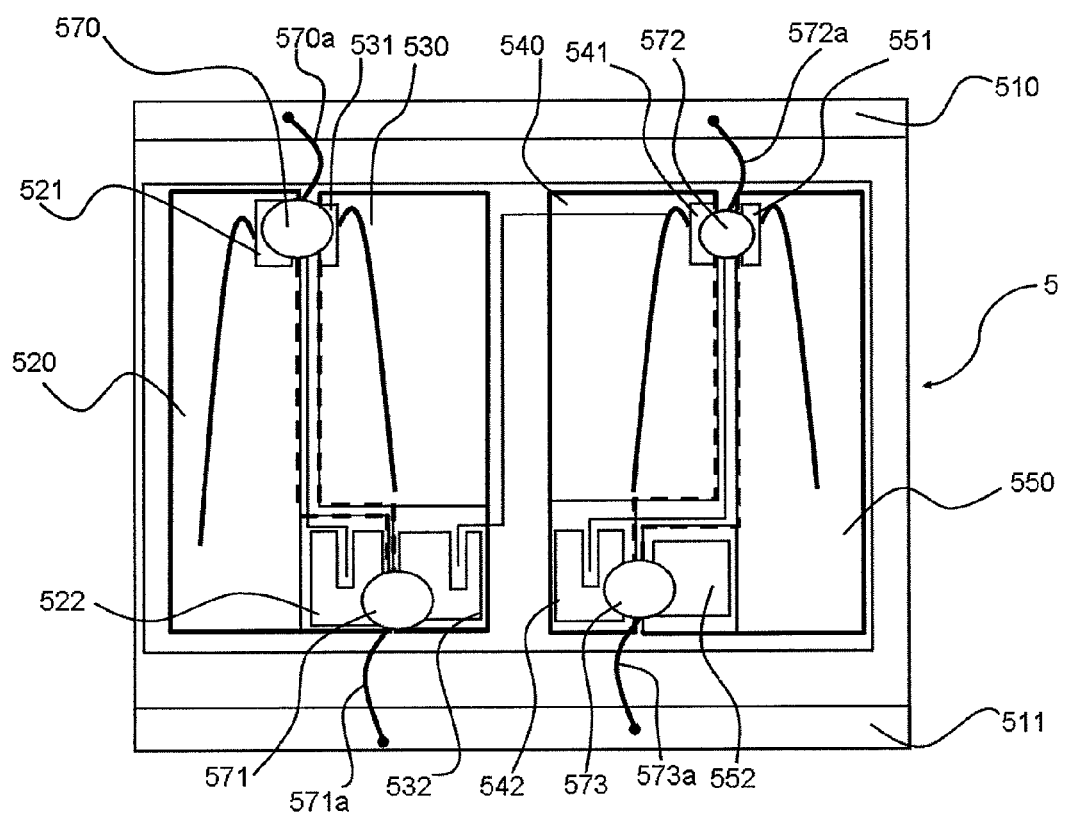
FIG. 5B illustrates a top view for a light-emitting diode device with light-emitting diodes in parallel connection in accordance with the second embodiment of the present application.

As shown in FIG. 5B, the packaged device 5 is similar to the device described in the first embodiment. The packaged device 5 is set with a first conductive port 510 and second conductive port 511. The first electrode 521 and the first electrode 531 of the light-emitting diodes 520, 530 are commonly soldered with a conductive solder ball 570 which has a first wire 570a to connect to the first conductive port 510. The second electrode 522 and the second electrode 532 are commonly soldered with a conductive solder ball 571 which has a first wire 571a to connect to the second conductive port 511.

The above soldering processes connect the light-emitting diodes 520, 530 in parallel. Similarly, the first electrode 541 and the first electrode 551 of the light-emitting diodes 540, 550 are commonly soldered with a conductive solder ball 572 which has a first wire 572a to connect to the first conductive port 510. The second electrode 542 and the second electrode 552 are commonly soldered with a conductive solder ball 573 which has a first wire 572a to connect to the second conductive port 511. The above soldering processes connect the light-emitting diodes 540, 550 in parallel. The conductive solder balls 570, 571, 572, 573 may be gold balls, and the first wire 570a, 572a and the second wire 571a, 573a may be gold wires.

Figure 5C:
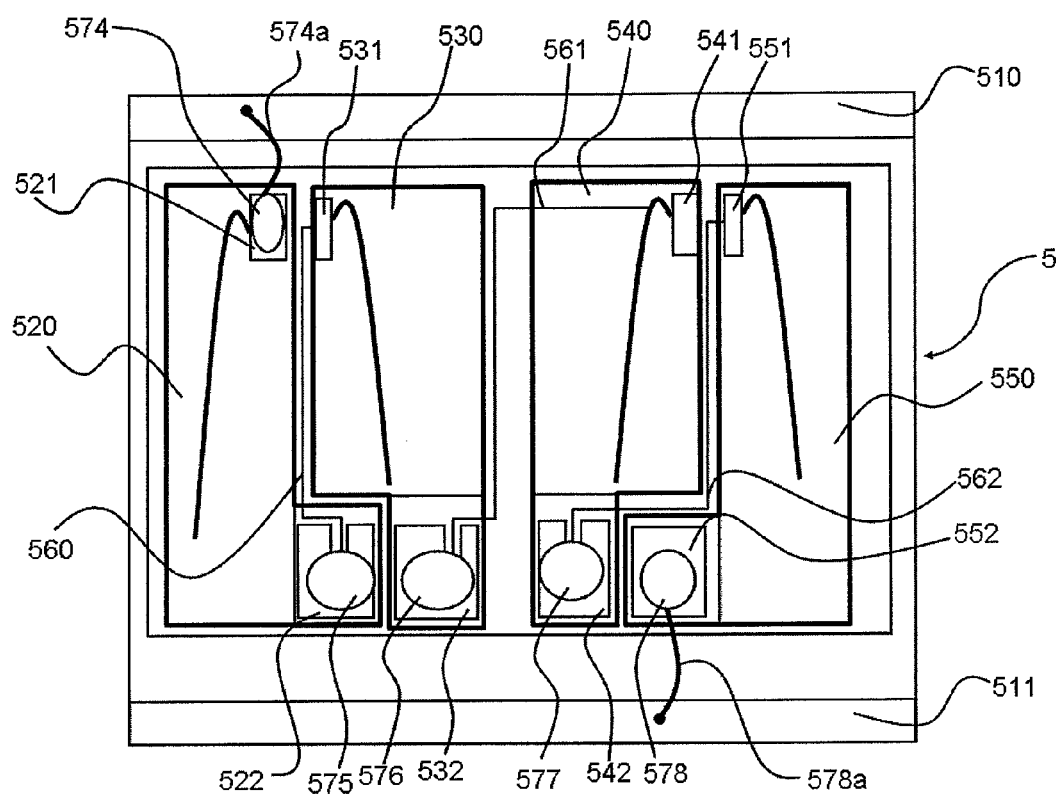
FIG. 5C illustrates a top view for a light-emitting diode device with light-emitting diodes in series connection in accordance with the second embodiment of the present application.

As shown in FIG. 5C, the first electrode 521 of the light-emitting diode 520 is soldered with a conductive solder ball 574 which has a first wire 574a to connect to the first conductive port 510. The second electrode 522 and the end of the conductive layer 560 which extends to the adjacent area of the second electrode 522 are commonly soldered with a conductive solder ball 575, so the second electrode 522 of the light-emitting diode 520 is electrically coupled to the first electrode 531 of the light-emitting diode 530. The second electrode 532 and the end of the conductive layer 561 which extends to the adjacent area of the second electrode 532 are commonly soldered with a conductive solder ball 576, so the second electrode 532 of the light-emitting diode 530 is electrically coupled to the first electrode 541 of the light-emitting diode 540. The second electrode 542 and the end of the conductive layer 562 which extends to the adjacent area of the second electrode 542 are commonly soldered with a conductive solder ball 577, so the second electrode 542 of the light-emitting diode 540 is electrically coupled to the first electrode 551 of the light-emitting diode 550. The second electrode 552 of the light-emitting diode 550 is soldered with a conductive solder ball 578 which has a second wire 578a to connect to the second conductive port 511. The above soldering processes connect the light-emitting diodes 520, 530, 540, and 550 in series between the first wire 574a and the second wire 578a. The conductive solder balls 574, 575, 576, 577, and 578 may be gold balls, and the first wire 574a and the second wire 578a may be gold wires.

Similar to the first embodiment, the first electrodes 531, 541, 551 can be viewed as a first electrode for series connection. The second electrode 522, 532, 542 can be viewed as a second electrode for series connection. The first electrode 521 can be viewed as a first electrode for the serially connecting to an external power, and the second electrode 552 can be viewed as a second electrode for serially connecting to an external power. According to the first and second embodiments, a plurality of light-emitting diodes in series connection comprises at least a first electrode and a second electrode for series connection, and a first electrode and a second electrode for connection to an external power.

Therefore, by the arrangement of the position of the electrodes of the structure of the light-emitting diode and the layout of the light-emitting diodes, this application provides a method and a structure for light-emitting diodes in a series or parallel connection with reduced soldering processes, solves the problems of too many soldering wires used in conventional process, and reduces the resultant risk of broken wires. In addition, in contrast to the conventional process that needs a precise alignment of the electrodes of light-emitting diodes for the soldering machine, this application provides a light-emitting diode structure with an area of two electrodes for soldering, and thus increases the throughput of the wire-soldering machine by an easier and more precise alignment. Furthermore, because the conductive layer extends to an adjacent area of the second electrode of the light-emitting diode and does not contact the second electrode, and the first/second electrodes are set close to each other, this application overcomes the disadvantage that the conventional process needs more space between light-emitting diodes spared for wires to be soldered.

The foregoing description has been directed to the specific embodiments of this invention. It will be apparent; however, that other alternatives and modifications may be made to the embodiments without escaping the spirit and scope of the application.

What is claimed is:

1. A light-emitting diode structure comprising:
   a substrate;
   a plurality of light-emitting diodes on the substrate, wherein each of the light-emitting diodes has an electrical coupling side, and along the electrical coupling side a first electrode and a second electrode are formed on the surface of the light-emitting diode, wherein a pair of light-emitting diodes is formed by pairing the plurality of the light-emitting diodes with the electrical coupling sides adjacent to each other so a distance between the first electrodes of the pair of light-emitting diodes and a distance between the second electrodes of the pair of light-emitting diodes are respectively small enough for soldering at the same time; and
   a conductive layer formed on the light-emitting diode structure, wherein in the pair of light-emitting diodes one end of the conductive layer is connected to the first electrode of one of the light-emitting diodes, and the other end of the conductive layer extends to an adjacent area of the second electrode of the other light-emitting diode with a distance for soldering to the second electrode at the same time,
   wherein a dielectric layer is formed between the light-emitting diodes and the conductive layer, and
   wherein each of the second electrodes has a recess for the other end of the corresponding conductive layer to extend into.

2. The light-emitting diode structure as claimed in claim 1, wherein the plurality of the light-emitting diodes forms one or more light-emitting diode groups containing at least two of the light-emitting diodes wherein the electrical coupling sides of the two light-emitting diodes are complementarily concave and convex for the second electrodes of the two light-emitting diodes located thereto.

3. The light-emitting diode structure as claimed in claim 1, wherein the distance between the first electrodes, the distance between the second electrodes, and the distance between the other end of the conductive layer and the second electrode are less than 100 μm.

4. The light-emitting diode structure as claimed in claim 1, wherein at least one of the first electrodes which is not connected to one end of the conductive layer is used as a first electrode for an external power connection; at least one of the second electrodes which the other end of the conductive layer does not extend to an adjacent area thereof is used as a second electrode for the external power connection, wherein the first electrode for the external power connection and the second electrode for the external power connection are on different light-emitting diodes.

5. The light-emitting diode structure as claimed in claim 1, wherein each of the light-emitting diodes comprises a p-type semiconductor and an n-type semiconductor wherein the first electrode is formed on the p-type semiconductor and the second electrode is formed on the n-type semiconductor.

6. A packaged light-emitting diode device comprising:
   a carrier board with a first conductive port and a second conductive port thereon;
   a light-emitting diode structure comprising:
      a substrate on the carrier board; and
      a plurality of light-emitting diodes on the substrate, wherein each of the light-emitting diodes has a first electrode and a second electrode; and a conductive layer on the light-emitting diode structure, wherein one end of the conductive layer is connected to the first electrode of one of the light-emitting diodes, and the other end of the conductive layer extends to an adjacent area of the second electrode of an adjacent light-emitting diode;

a solder ball soldered on the other end of the conductive layer and the second electrode of the adjacent light-emitting diode;

a first conductive wire having one end connected to the first electrode of the one light-emitting diode, and having the other end connected to the first conductive port; and a second conductive wire having one end connected to the second electrode of the adjacent light-emitting diode, and having the other end connected to the second conductive port.

7. The packaged light-emitting diode device as claimed in claim 6, wherein the distance between the other end of the conductive layer and the second electrode of the adjacent light-emitting diode is less than 100 μm.

8. The packaged light-emitting diode device as claimed in claim 6, wherein the first electrode of the one light-emitting diode and the second electrode of the adjacent light-emitting diode are on different light-emitting diodes.

9. The packaged light-emitting diode device as claimed in claim 6, wherein each of the light-emitting diodes has an electrical coupling side, and the first electrodes and the second electrodes are on the surface of the light-emitting diode along the electrical coupling side, wherein a pair of light-emitting diodes is formed by pairing the plurality of the light-emitting diodes with the electrical coupling sides adjacent to each other so a distance between the first electrodes of the pair of light-emitting diodes and a distance between the second electrodes of the pair of light-emitting diodes are respectively small enough for soldering at the same time.

10. The packaged light-emitting diode device as claimed in claim 9, wherein the distance between the first electrodes, and the distance between the second electrodes are less than 100 μm.

11. The packaged light-emitting diode device as claimed in claim 9, wherein the plurality of the light-emitting diodes forms one or more light-emitting diode groups containing at least two of the light-emitting diodes wherein the electrical coupling sides of the two light-emitting diodes are complementarily concave and convex for the second electrodes of the two light-emitting diodes located thereto.

12. The packaged light-emitting diode device as claimed in claim 6, wherein the first conductive port and the second conductive port are lead frames.

13. The packaged light-emitting diode device as claimed in claim 6, wherein the second electrode of the adjacent light-emitting diode has a recess for the other end of the corresponding conductive layer to extend into.

14. The light-emitting diode structure as claimed in claim 1, wherein the conductive layer and the second electrode of the other light-emitting diode are substantially coplanar in the adjacent area of the second electrode of the other light-emitting diode.

15. The light-emitting diode structure as claimed in claim 1, wherein the conductive layer and the substrate are respectively disposed on opposite sides of the plurality of light-emitting diodes.

16. A light-emitting diode structure comprising:
a substrate;
a plurality of light-emitting diodes on the substrate, wherein each of the light-emitting diodes has an electrical coupling side, and along the electrical coupling side a first electrode and a second electrode are formed on the surface of the light-emitting diode, wherein a pair of light-emitting diodes is formed by pairing the plurality of the light-emitting diodes with the electrical coupling sides adjacent to each other so a distance between the first electrodes of the pair of light-emitting diodes and a distance between the second electrodes of the pair of light-emitting diodes are respectively small enough for soldering at the same time; and
a conductive layer formed on the light-emitting diode structure, wherein in the pair of light-emitting diodes one end of the conductive layer is connected to the first electrode of one of the light-emitting diodes, and the other end of the conductive layer extends to an adjacent area of the second electrode of the other light-emitting diode with a distance for soldering to the second electrode at the same time, wherein the electrical coupling sides of the pair of light-emitting diodes are complementarily concave and convex for the second electrodes of the pair of light-emitting diodes located thereto.

* * * * *